(12) United States Patent
Hsuan et al.

(10) Patent No.: US 10,165,693 B2
(45) Date of Patent: Dec. 25, 2018

(54) ATTACHMENT DEVICE FOR MICRO DEVICES AND WEARABLE MICRO DEVICES HAVING THE ATTACHMENT DEVICE

(71) Applicants: Min-Chih Hsuan, Hsinchu (TW); Yu-Han Huang, Hsinchu (TW)

(72) Inventors: Min-Chih Hsuan, Hsinchu (TW); Yu-Han Huang, Hsinchu (TW)

(*) Notice: Subject to any disclaimer, the term of this patent is extended or adjusted under 35 U.S.C. 154(b) by 0 days.

(21) Appl. No.: 15/254,673

(22) Filed: Sep. 1, 2016

(65) Prior Publication Data

US 2017/0135231 A1 May 11, 2017

(30) Foreign Application Priority Data

Nov. 11, 2015 (TW) ................................. 104137248

(51) Int. Cl.
| | |
|---|---|
| *H05K 5/00* | (2006.01) |
| *A41F 1/00* | (2006.01) |
| *A44B 18/00* | (2006.01) |
| *F16B 1/00* | (2006.01) |
| *F16B 47/00* | (2006.01) |

(52) U.S. Cl.
CPC ........... *H05K 5/0086* (2013.01); *A41F 1/002* (2013.01); *A44B 18/00* (2013.01); *F16B 1/00* (2013.01); *F16B 47/00* (2013.01); *F16B 2001/0028* (2013.01); *F16B 2001/0035* (2013.01)

(58) Field of Classification Search
CPC ....... H05K 5/0086; A41F 1/002; A44B 18/00; F16B 1/00; F16B 47/00
See application file for complete search history.

(56) References Cited

U.S. PATENT DOCUMENTS

| | | | | |
|---|---|---|---|---|
| 6,151,208 | A * | 11/2000 | Bartlett | ................ G06F 1/1626 |
| | | | | 361/679.03 |
| 9,309,012 | B1 * | 4/2016 | Kilgore | ................ G03B 17/561 |
| 9,317,076 | B2 * | 4/2016 | Rayner | ................ F16M 13/00 |
| 9,377,157 | B1 * | 6/2016 | Kilgore | ............. F16M 11/2064 |
| 9,388,934 | B1 * | 7/2016 | Kilgore | ................ H04N 5/2251 |
| 2011/0043496 | A1 * | 2/2011 | Ray Avalani | ............ B60R 1/00 |
| | | | | 345/204 |
| 2013/0198935 | A1 * | 8/2013 | Waters | .................... A42C 5/00 |
| | | | | 2/209.13 |

(Continued)

FOREIGN PATENT DOCUMENTS

| | | |
|---|---|---|
| CN | 203851921 U | 10/2014 |
| CN | 204033323 U | 12/2014 |

(Continued)

*Primary Examiner* — Binh Tran
*Assistant Examiner* — Douglas Burtner
(74) *Attorney, Agent, or Firm* — Muncy, Geissler, Olds & Lowe, P.C.

(57) ABSTRACT

The present invention relates to an attachment device for micro devices, comprising a main body and an attachment member seat in connection with the main body. The main body provides a receiving space to accommodate a functional module element. The attachment member seat provides a cavity to accommodate at least one attachment member to attach the attachment device to an article. A wearable micro device comprising the functional module element and the attachment device is also disclosed.

13 Claims, 3 Drawing Sheets

(56) References Cited

U.S. PATENT DOCUMENTS

| | | | | |
|---|---|---|---|---|
| 2013/0303000 A1* | 11/2013 | Witter | ................ | H01R 13/6205 |
| | | | | 439/39 |
| 2014/0111948 A1* | 4/2014 | Ma | ........................... | A45B 3/00 |
| | | | | 361/729 |
| 2014/0195826 A1* | 7/2014 | Wojcik | ................. | H05K 5/0086 |
| | | | | 713/300 |
| 2014/0237028 A1* | 8/2014 | Messenger | ............. | G06Q 30/02 |
| | | | | 709/203 |
| 2014/0263908 A1* | 9/2014 | Franklin | ................ | F16M 13/02 |
| | | | | 248/309.4 |
| 2015/0087949 A1* | 3/2015 | Felix | .................. | A61B 5/04087 |
| | | | | 600/382 |
| 2015/0378391 A1* | 12/2015 | Huitema | ................. | G06F 1/163 |
| | | | | 361/679.03 |
| 2016/0003270 A1* | 1/2016 | Franklin | .................... | F16B 1/00 |
| | | | | 439/529 |
| 2016/0018846 A1* | 1/2016 | Zenoff | ................... | G09G 3/002 |
| | | | | 345/174 |
| 2016/0040693 A1* | 2/2016 | Popovski | ................ | B60R 13/02 |
| | | | | 24/303 |
| 2016/0068117 A1* | 3/2016 | Huelke | ................ | H01F 7/0252 |
| | | | | 24/303 |
| 2017/0003711 A1* | 1/2017 | Rowley | ................... | G06F 1/166 |
| 2017/0042450 A1* | 2/2017 | Tanaka | ..................... | A61B 1/00 |
| 2017/0060110 A1* | 3/2017 | Lee | ....................... | G06F 1/1632 |

FOREIGN PATENT DOCUMENTS

| | | |
|---|---|---|
| TW | 200814900 A | 3/2008 |
| TW | I319987 B | 2/2010 |
| TW | 201115404 A | 5/2011 |
| TW | M493362 U | 1/2015 |

\* cited by examiner

ATTACHMENT DEVICE FOR MICRO DEVICES AND WEARABLE MICRO DEVICES HAVING THE ATTACHMENT DEVICE

FIELD OF THE INVENTION

The present invention relates to an attachment device for micro devices and, more particularly, to an attachment device provided with multiple attachment members, to detachably attach a micro device to an article. The micro device may comprise a microelectronic module or a non-electronic functional module. The present invention also discloses a micro device having such an attachment device.

BACKGROUND OF THE INVENTION

Stand-alone micro devices are very popular in the market. These micro devices are configured to be wearable by users and support a variety of applications. The wearable micro devices are generally equipped with a plurality of functional modules, such as detector module, processing module and wireless communication module, wherein the processing module processes detection results of the detector module and provides its output signals to external through the wireless communication module. The wireless communication module is generally provided with short-distance communication capabilities and is configured to exchange data with an external computer device through particular communication protocols.

In addition, various non-electronic functional modules, such as non-electronic functional devices in the fields of biology, physics, chemistry and medical science, have been presented in the industry. These non-electronic functional devices are also made in a micro device, with or without electronical circuitry to independently provide all kinds of desired functions, such as detection and testing.

To provide these or similar micro devices wearability, a variety of devices designed to attach a micro device to an object, generally the body of a person wearing the micro device, is developed. In most cases, they are wristbands, necklaces and so on.

For example: CN 203851921U disclosed an intelligent bracelet comprising a wireless communication intelligent card and a bracelet to be worn on the wrist of a user.

CN 204033323U disclosed an intelligent medical bracelet comprising an electronic die provided with sensors and a bracelet to accommodate the electronic die and to be worn on the wrist of a user.

TW 2008-14900 disclosed a portable and modular multi-functional communication device, wherein the communication device is modularized to form a variety of shapes, to be embedded into different carriers for respectively particular methods of wear. The carrier may be a wristbands, a necklace, and other plug-ins.

TW 2011-15404 disclosed a wearable input device, also comprising a bracelet to be worn on the wrist.

TW I319987 disclosed a device for sensing human respiratory gases. The device is clamped in the outer wall of a human nose with a holding member.

TW M493362 disclosed a wearable electronic device, such as the formation of the shape of the watch, and the wrist strap configuration.

US 2015/0087949 disclosed a electrocardiographic and physiological sensor to be worn by a patient using a flexible backplane.

While in the above-described conventional technology wearable micro devices are provided, there are no attachment devices that can support different functionalities and environment with/in which the micro devices are used. Most attachment devices can only serve one particular type of micro device and/or particular environment of use.

OBJECTIVES OF THE INVENTION

The objective of the present invention is to provide a wearable micro device that can be attached to a variety of objects in accommodation with the environment where the micro device is used.

Another objective of this invention is to provide an attachment device for micro devices, whereby the micro device can be attached to a variety of objects in accommodation with the application conditions of the micro device.

Another objective of this invention is to provide a universal attachment device for micro devices, whereby the micro device can be attached to a variety of objects according to needs in application.

SUMMARY OF THE INVENTION

According to the embodiments of the present invention, an attachment device for micro devices is provided. The attachment device comprises a main body and an attachment member seat in connection with the main body. The main body provides a receiving space in accommodation with a functional module element, e.g., a microelectronic device. In the preferred embodiment of the present invention, the receiving space may be a recess, wherein a flange is provided in an opening of the recess, extended inwardly to hold the functional module element firmly in the receiving space. In this example, a surface of the functional module element may be exposed to the external.

The attachment member seat provides a space for accommodating and fixing at least one attachment member that attaches the attachment device to an object.

In an embodiment of the present invention, the attachment member seat further forms a suction cup.

The present invention also provides a plurality of attachment members, embedded in the attachment member seat. The attachment member may be a magnet, a Velcro, or their combination. The Velcro may be provided on a rigid substrate, and the rigid substrate may cover the space formed in the attachment member seat.

The attachment device may further include a battery seat embedded in the main body to receive an object, such as a battery.

An annular groove may be provided at a specific position in the attachment device, to accommodate a circular object or a ribbon to be worn by a user or to connect with a clamp or a clip.

The attachment device may be formed substantially in the shape of a block material, for example, a circular plate or a square plate, to be attached into a conventional micro-device attachment device.

The present invention also provides a wearable micro device, comprising a functional module element, e.g., a microelectronic device, and an attachment member having the above mentioned features; the functional module element is accommodated in the receiving space of the attachment device. If the function module element is a microelectronic device, electric contacts are provided in the receiving space and/or in the battery seat; wherein the contacts of the receiving space and the contacts of the battery seat are connected by wires.

In a particular embodiment of the invention, the attachment device further comprises a micro-switch provided in a surface of the attachment device, and wires are provided to connect contacts of the battery seat with the micro switch, to control power supply of a battery in the battery seat.

A micro device or an attachment device having the above features may be removably attached to a surface of an object, e.g., by a sucking force of the sucking cup, a magnetic force of the magnet, a frictional force of the Velcro, or connected to an object such as a necklace, a wristband, a clamp or a clip, or clipped to a piece of object.

Embodiments of the present invention will be described in more details in the following, by referring to the following drawings.

DETAILED DESCRIPTION OF THE INVENTION

The present invention provides a wearable micro device. The micro device can be detachably attached to an object in a variety of manners, therefore to accommodate the functionality and application environment of the micro device.

Figure 1:
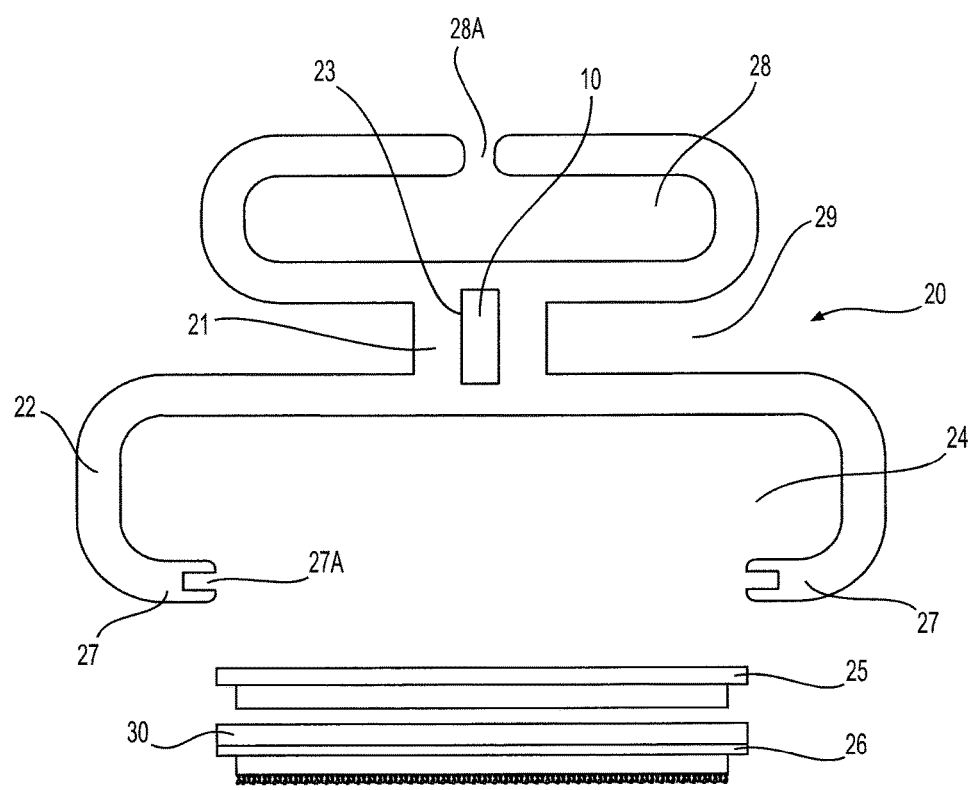
FIG. 1 shows the schematic view of the structure of a wearable micro device according to a first embodiment of the present invention.

FIG. 1 shows the schematic view of the structure of a wearable micro device according to a first embodiment of the present invention. In the illustrated embodiment, the micro device includes a microelectronic device 10 and an attachment device 20. However, those having ordinary skills in the field would appreciate, the attachment device of this invention is applicable to any functional module element with small or miniature sizes, in addition to microelectronic devices. A non-electronic functional element such as those used in the fields of biology, physics, chemistry, medical science, may also be accommodated in the invented attachment device, to be detachably attached to an object.

In the embodiment of FIG. 1, the microelectronic device 10 is a wireless sensor, e.g., a wireless temperature sensor, a wireless vibration sensor, a wireless humidity sensor, a wireless multiple function sensor or the like. The microelectronic device 10 may be simply a wireless transmitter that sends out a device code signal to the outside world continuously. The microelectronic device 10 may also be a functional module with a plurality of functionalities and comprises a sensor and a microprocessor or microcontroller. The microprocessor processes sensing results of the sensor and provides its output signals to external through a wireless communication module. The microelectronic device 10 is generally provided with short-distance communication capabilities and is configured to exchange data with an external computer device through particular communication protocols.

In the embodiment of FIG. 1, an attachment device 20 for the micro device is provided. The attachment device 20 has a main body 21 and an attachment member seat 22 in connection with the main body 21. The main body 21 provides a receiving space 23 for accommodating a functional module element, such as the microelectronic device 10. The attachment member seat 22 provides a space 24 for accommodating and fixing at least one attachment member 25, 26 that attaches the attachment device 20 to an object.

Also in the embodiment of FIG. 1, the attachment member seat 22 forms cylindrical shape and includes a base and side walls extended vertically in respect with the base. The base and the side walls define the accommodation space 24. This accommodation space 24 serves to accommodate attachment members 25, 26. In this embodiment, the open end of the cylindrical wall of the attachment member seat 22 is formed to provide flanges 27 extended inwardly to the accommodation space 24. At the ends of the flange 27 an annular groove 27A is formed. In this embodiment, the attachment members 25, 26 are a magnet 25 and a Velcro 26, both form a disc shape to adapt the shape of the space 24. As a result thereof, the magnet 25 and the Velcro 26 can be easily accommodated in the space 24, and are preferably configured such that the magnets 25 and the Velcro 26 are securely attached to the base of the attachment member seat 22. The Velcro 26 may be provided on a rigid substrate 30, and is tightly integrated with the magnet 25, for example, by an adhesive binding. Preferably the rigid substrate 30 of the Velcro 26 covers the space 24 formed in the attachment member seat 22 and is engaged in the annular groove 27A with its edges. The magnet 25 may be fixed to the base of the attachment member seat 22 by e.g. an adhesive. As such, the attachment members 25, 26 are firmly secured to the attachment device 20.

In other embodiments of the present invention, the attachment member may include only either one of a magnet and a Velcro. In other embodiments, the Velcro 26 is not adhered to a rigid substrate, but rather directly adhered to the magnet 25.

In a general application, the receiving space 23 is formed in the main body 21 and the functional module element 10 is, for example, embedded in the main body 21, during the process of forming the main body 21. However, in other embodiments, the receiving space 23 provides an opening to allow insertion of the microelectronic device 10 into the receiving space 23 through the opening, after the production of the main body 21 is completed.

The attachment device 20 further comprises a battery seat 28 provided in the main body 21, for receiving an object such as a battery. In this example, the attachment device 20 provides electric contacts (not shown) in the receiving space 23 and in the battery seat 28. The contacts of the receiving space 23 and the contacts of the battery seat 28 are connected by wires (not shown). However, those having ordinary skills in the art may appreciate that, in case the functional module element 10 is not a microelectronic device or is any device that does not need electric power, the battery seat 28 may be omitted, and so are the associated electrical contacts and wires.

In the embodiment of FIG. 1, the battery seat 28 forms an opening 28A, for a battery to be inserted or removed through the opening. However, those having ordinary skills in the art may appreciate that the battery seat 28 may not provide any opening 28A, because replacement of battery is not an essential feature of such micro devices.

Also, in the embodiment of FIG. 1, an annular groove 29 is formed at approximately a gravity center of the main body 21 of the attachment device 20, for receiving an annular object or a ribbon (both not shown). The annular object can be attached to a clamp or a clip, for the attachment of the attachment device 20. The ribbon may be worn by a user, for example, on the neck, on the wrist, or other part of the human body, or suspended at a desired place.

In addition, the width of the annular groove 29 can also be defined, such that it can clamp on a piece of object, for affixing the attachment device 20 to the piece of object. In order to improve this function, width within the annular groove 29 can be designed as uneven in the radial direction. For example, width at the peripheral of the annular groove may be narrower than that at the deeper positions, so that the annular groove may clamp on the piece of material.

In the embodiment of FIG. 1 a micro-switch (not shown) may be provided in a surface of the attachment device 20, and wires are provided to connect contacts of the battery seat 28 with the micro switch, to control power supply of a battery in the battery seat 28.

An attachment device 20 according to the present invention may be prepared by any suitable material in the known technique. For example, a flexible material, a shape memory material, even a rigid material, may be used to produce the attachment device 20 by, for example, a molding method. The functional module element 10 may be prepared first, then at the time of forming the attachment device 20, the functional module element 10 is included in the material of the attachment device 20, together with necessary wires. In addition, the attachment device 20 is not limited to a single kind of material, or in the form of a single element. For example, the flange 27 of the accommodation space 24 may be made in the form of a collar 27. The battery seat 28 may also include a cap to replace the opening 28A. In addition, if an opening 28A is provided, the battery seat 28 is preferably made of flexible material or a shape memory material. Nevertheless, if a narrower width is provided at the peripheral of the annular groove 29, this part is preferably made of a flexible material or a shape memory material.

Figure 2:
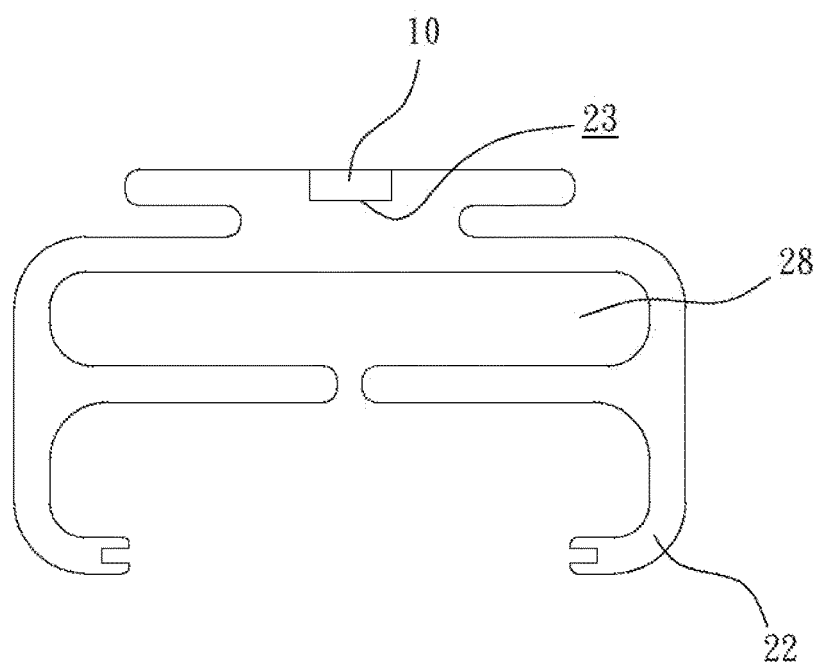
FIG. 2 shows the schematic view of the structure of a wearable micro device according to a second embodiment of the present invention.

FIG. 2 shows the schematic view of the structure of a wearable micro device according to a second embodiment of the present invention. The micro device or attachment device 20 shown in FIG. 2 has substantially the same structure of that of FIG. 1. Therefore, the embodiment of FIG. 2 has substantially most features of the embodiment of FIG. 1. The differences between them are, in FIG. 2 the receiving space 23 is formed on the surface of the main body 21, and exposed to the external of the main body 21 with one surface. In the preferred embodiment of the present invention, the receiving space 23 is formed a recess to accommodate the functional module element 10 in the receiving space 23. The opening of the recess 23 may form a flange (not shown), in order to strengthen its holding function. The embodiment of FIG. 2 is more suitable for a functional module element 10 that requires interaction with the environment when operation, for example, to detect an ambient temperature, pressure, humidity, light and darkness and other environmental parameters, or to contact the outside world for purpose of operation and control. Furthermore, if the functional module element 10 includes an imaging device, the light incident side can be placed in the opening, facing the outside.

In the embodiment of FIG. 2, to adapt to the position of the functional module element 10, the battery seat 28 is provided on the side near to the attachment member seat 22.

Figure 3:
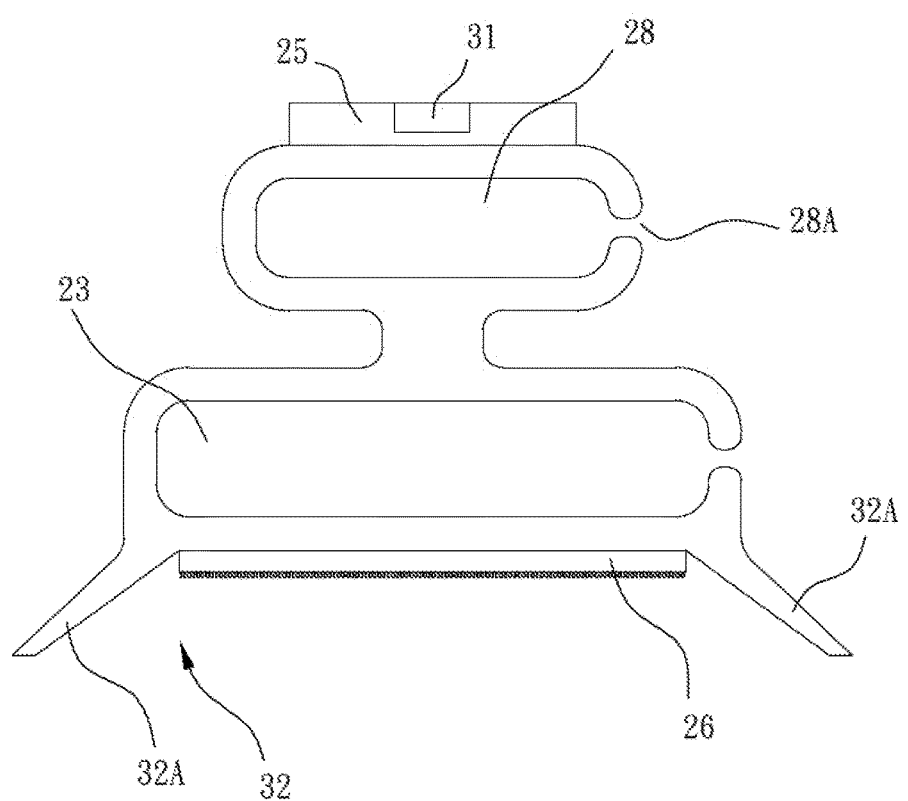
FIG. 3 shows the schematic view of the structure of a wearable micro device according to a third embodiment of the present invention.

FIG. 3 shows the schematic view of the structure of a wearable micro device according to a third embodiment of the present invention. The micro device or attachment device 20 shown in FIG. 3 has substantially the same structure of that of FIG. 1 and FIG. 2. Therefore, the embodiment of FIG. 3 has substantially most feature of the embodiment of FIG. 1 and/or FIG. 2. The differences between this embodiment and the embodiments of FIG. 1 and FIG. 2 are, in the embodiment of FIG. 3 an opening 28A of the battery seat 28 is provided at the lateral circumference of the battery seat 28, so that the front surface (upper surface in the drawing) of the battery seat 28 can be used to adhere or otherwise provide a magnet 25. The magnet 25 may form a ring to be provided on the front surface of the attachment device 20, so to provide at its central portion a space for accommodating a micro-switch 31 therein. Wire is provided to connect the micro switch 31 and the battery seat 28, for controlling the power supply of a battery received in the battery seat 28. If no micro-switch 31 is provided, the central space of the magnet ring 25 can be used to receive other attachment members, such as a hook, a buckle and the like.

The embodiment of FIG. 3 provides a large receiving space 23 for accommodating a bulky functional module element 10, such as an electronic or non-electronic device comprising a circuit board. The opening of the receiving space 23 is located on the lateral circumference of the attachment device. However those having ordinary skills in the art may appreciate that the opening is not an essential feature. Electric and/or signal contacts may also be provided in the receiving space 23, and wire may be provided to connect the contacts with contacts provided in the battery seat 28.

In the embodiment of FIG. 3, a sucking cup 32 is further provided at the back surface (lower surface in the drawing) by the attachment member seat 22 of the attachment device 20. In the example shown in FIG. 3, the sucking cup 32 is formed by the horn-like extensions 32A of the main body 21. The horn-like extensions 32A is made of a flexible material and define a sucking space. The horn-like extensions 32A deforms upon pressing the attachment device 20 downward, so that the sucking space is narrowed. The restoring force of the horn-like extensions 32A makes the air pressure in the sucking space lower than the ambient atmospheric pressure, therefore attaches the attachment device 20 to the plane where the horn-like extensions contact.

In the embodiment of FIG. 3, the Velcro 26 is provided at the base of the sucking cup 32 and is attached to the base by e.g. adhesives. The horn-like extensions 32A may be lifted to expose the Velcro 26, whereby the attachment device 20 may be attached to another Velcro through the Velcro 26 of the main body 21.

A micro device or an attachment device having the features described above may be formed substantially in a block of material, such as a circular plate or a square plate, to be embedded into a conventional attachment device for micro devices. An example of such conventional attachment device is shown in, for example, the aforementioned portable modular carrier disclosed TW 2008-14900.

As described above, the present invention provides a wearable micro device. The micro device comprises a functional module element, e.g., a microelectronic device, and an attachment device having the above mentioned features. The functional module element is accommodated in the receiving space of the attachment device. The attachment device may be detachably secured to a variety of objects, by e.g. a sucking force, a magnetic force, a frictional force, to a surface with magnetic character, with a planar surface or having a Velcro. The attachment device may also be connected to a necklace, a wrist strap, a clamp, a clip, or claim on a piece of object.

What is claimed is:

1. A wearable micro device, comprising:

an attachment device comprising a main body, an attachment member seat in connection with the main body, and an annular groove between the main body and the attachment member seat; wherein the main body provides a receiving space and the attachment member seat provides a space for accommodating and fixing at least two attachment members, each to attach the attachment device to an object; and a functional module element embedded in the receiving space of the attachment device wherein the attachment member seat forms cylindrical shape and includes a base and side walls extended vertically in respect with the base, wherein the base and the side walls define the space for accommodating and fixing.

2. The micro device according to claim 1, wherein the functional module element comprises a sensor and a microprocessor or microcontroller, and is provided with short-distance communication capabilities.

3. The micro device according to claim 1, wherein one of the at least two attachment members is provided on a rigid substrate and the rigid substrate covers the space formed in the attachment member seat.

4. The micro device according to claim 1, further comprising a battery seat in connection with the main body for receiving a battery.

5. The micro device according to claim 4, further comprising a micro-switch provided in a surface of the attachment device.

6. The micro device according to claim 3, further comprising a battery seat in connection with the main body for receiving a battery.

7. The micro device according to claim 6, further comprising a micro-switch provided in a surface of the attachment device.

8. The micro device according to claim 1, wherein the annular groove is configured to accommodate a circular object or a ribbon.

9. The micro device according to claim 1, wherein the attachment member seat of the attachment device further extends to form a sucking cup.

10. The micro device according to claim 1, wherein the at least two attachment members comprise a combination of a magnet and a hook and loop fastener.

11. The micro device according to claim 1, wherein the functional module element is embedded in the main body during the process of forming the main body.

12. The micro device according to claim 4, wherein the functional module element is embedded in the main body during the process of forming the main body.

13. The micro device according to claim 6, wherein the functional module element is embedded in the main body during the process of forming the main body.

* * * * *